United States Patent
Sultan et al.

(10) Patent No.: US 7,582,493 B2
(45) Date of Patent: Sep. 1, 2009

(54) DISTINGUISHING BETWEEN DOPANT AND LINE WIDTH VARIATION COMPONENTS

(75) Inventors: Akif Sultan, Austin, TX (US); James F. Buller, Austin, TX (US); David Donggang Wu, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 306 days.

(21) Appl. No.: 11/538,872

(22) Filed: Oct. 5, 2006

(65) Prior Publication Data

US 2008/0085570 A1 Apr. 10, 2008

(51) Int. Cl.
*H01L 21/66* (2006.01)
(52) U.S. Cl. ....................................................... 438/18
(58) Field of Classification Search ........................ None
See application file for complete search history.

(56) References Cited

U.S. PATENT DOCUMENTS 6,876,208 B2 * 4/2005 Kunikiyo et al. ............ 324/658
6,898,561 B1 * 5/2005 Liu et al. ....................... 703/14

* cited by examiner

*Primary Examiner*—Charles D. Garber
*Assistant Examiner*—Andre' C Stevenson
(74) *Attorney, Agent, or Firm*—Williams, Morgan & Amerson, P.C.

(57) ABSTRACT

A test structure includes first and second pluralities of transistors. The first plurality of transistors includes gate electrodes of a first length. The second plurality of transistors includes gate electrodes of a second length different than the first length. A channel area of the transistors in the first plurality is substantially equal to a channel area of the transistors in the second plurality. A method for using the test structure includes measuring a performance metric of the first and second pluralities of transistors. Variation in the performance metric associated with the first plurality of transistors is compared to variation in the performance metric associated with the second plurality of transistors to identify a random length variation component associated with the first plurality of transistors.

19 Claims, 4 Drawing Sheets

600 — Provide a test structure including a first plurality of transistors having gate electrodes of a first length and a second plurality of transistors having gate electrodes of a second length different than the first length, wherein a channel area of the transistors in the first plurality is substantially equal to a channel area of the transistors in the second plurality 610 — Measure a performance metric of the first and second pluralities of transistors 620 — Compare variation in the performance metric associated with the first plurality of transistors to variation in the performance metric associated with the second plurality of transistors to identify a random length variation component associated with the first plurality of transistors

Figure 6

DISTINGUISHING BETWEEN DOPANT AND LINE WIDTH VARIATION COMPONENTS

CROSS-REFERENCE TO RELATED APPLICATIONS

Not applicable.

STATEMENT REGARDING FEDERALLY SPONSORED RESEARCH OR DEVELOPMENT

Not applicable

BACKGROUND OF THE INVENTION

The present invention relates generally to semiconductor manufacturing and, more particularly, to a method and test structure for distinguishing between dopant and line width variation components.

The manufacturing of semiconductor devices may involve many process steps. For example, semiconductor fabrication typically involves processes such as deposition processes, etching processes, thermal growth processes, various heat treatment processes, ion implantation, photolithography, etc. Such processes may be performed in any of a variety of different combinations to produce semiconductor devices that are useful in a wide variety of applications.

In general, there is a constant drive within the semiconductor industry to increase the operating speed and efficiency of various integrated circuit devices, e.g., microprocessors, memory devices, and the like. This drive is fueled by consumer demands for computers and electronic devices that operate at increasingly greater speeds and efficiency. This demand for increased speed and efficiency has resulted in a continual reduction in the size of semiconductor devices, e.g., transistors, as well as the packing density of such devices on an integrated circuit device. That is, many parameters of a typical field effect transistor (FET), e.g., channel length, junction depths, gate insulation thickness, and the like, are reduced. For example, all other things being equal, the smaller the channel length of the transistor or the thinner the gate insulation layer, the faster the transistor will operate. Thus, there is a constant drive to reduce the size, or scale, of the components of a typical transistor to increase the overall speed of the transistor, as well as integrated circuit devices incorporating such transistors.

Modern field effect transistors comprise a gate electrode, a gate insulation layer, a source region and a drain region. When an appropriate voltage is applied to the gate electrode, a channel region is formed between the source region and the drain region and electrons (or holes) flow between the source region and drain region. The source and drain regions of such transistors are normally the same. For example, for an NMOS transistor, both the source and drain regions are formed by introducing an N-type dopant material, e.g., arsenic, into the semiconductor material. For a PMOS transistor, the source and drain regions are formed by introducing a P-type dopant material, e.g., boron, into the semiconductor material.

As device geometries continually decrease, the effects of small variations in fabrication parameters have an increasingly noticeable effect on the performance of the completed devices. During the formation of the source and drain regions, there is some variation in the number of atoms that are implanted in the region adjacent the channel region, which is commonly referred to as the halo region. Implant variations cause variations in the effective channel length of the transistors. Due to the small geometries being fabricated, variations as small as a few hundred atoms can have an appreciable effect on the performance of the device. For instance, the threshold voltage of the device may be impacted by variation in the implants in the halo region.

Another factor that may affect performance parameters of the transistor, such as threshold voltage, is the length of the gate electrode. Variation in the length affects the physical channel length of the device. FIG. 1 illustrates a typical roll-off curve 100 relating the threshold voltage to changes in length. Typically, target values for the nominal length are selected at value near $L_1$ designated on the curve 100. The device roll-off is essentially flat for super-nominal and larger (i.e., greater than $L_1$) devices.

Because it is difficult to distinguish between these various sources of variation, such as random dopant or random length variation, it is difficult to adjust design or process parameters to reduce the variation. Moreover, as the effects of such variation sources are causing an increasingly noticeable impact on the overall variation of the fabricated devices, the lack of effective process or design control techniques may potentially reduce the performance, and ultimately, the profitability of the devices.

This section of this document is intended to introduce various aspects of art that may be related to various aspects of the present invention described and/or claimed below. This section provides background information to facilitate a better understanding of the various aspects of the present invention. It should be understood that the statements in this section of this document are to be read in this light, and not as admissions of prior art. The present invention is directed to overcoming, or at least reducing the effects of, one or more of the problems set forth above.

BRIEF SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

One aspect of the present invention is seen in a test structure including first and second pluralities of transistors. The first plurality of transistors includes gate electrodes of a first length. The second plurality of transistors includes gate electrodes of a second length different than the first length. A channel area of the transistors in the first plurality is substantially equal to a channel area of the transistors in the second plurality.

Another aspect of the present invention is seen in a method for using the test structure. The method includes measuring a performance metric of the first and second pluralities of transistors. Variation in the performance metric associated with the first plurality of transistors is compared to variation in the performance metric associated with the second plurality of transistors to identify a random length variation component associated with the first plurality of transistors.

BRIEF DESCRIPTION OF THE SEVERAL VIEWS OF THE DRAWINGS

The invention will hereafter be described with reference to the accompanying drawings, wherein like reference numerals denote like elements, and:

FIG. 6 is a simplified flow diagram of a method for distinguishing between dopant and line width performance variation in accordance with still another illustrative embodiment of the present invention.

Figure 1:
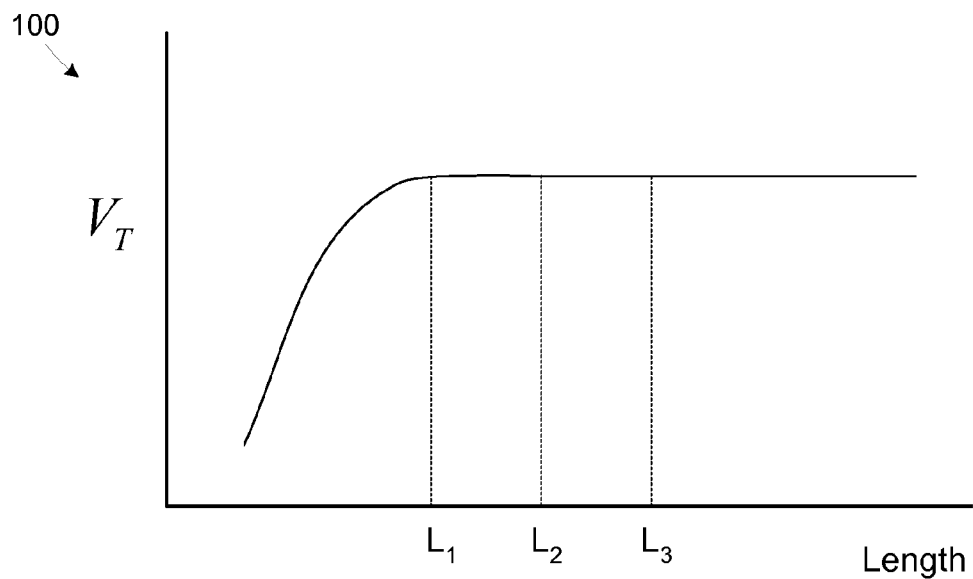
FIG. 1 is a curve illustrating the relationship between threshold voltage and length for a transistor device.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

One or more specific embodiments of the present invention will be described below. It is specifically intended that the present invention not be limited to the embodiments and illustrations contained herein, but include modified forms of those embodiments including portions of the embodiments and combinations of elements of different embodiments as come within the scope of the following claims. It should be appreciated that in the development of any such actual implementation, as in any engineering or design project, numerous implementation-specific decisions must be made to achieve the developers' specific goals, such as compliance with system-related and business related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure. Nothing in this application is considered critical or essential to the present invention unless explicitly indicated as being "critical" or "essential."

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Figure 2:
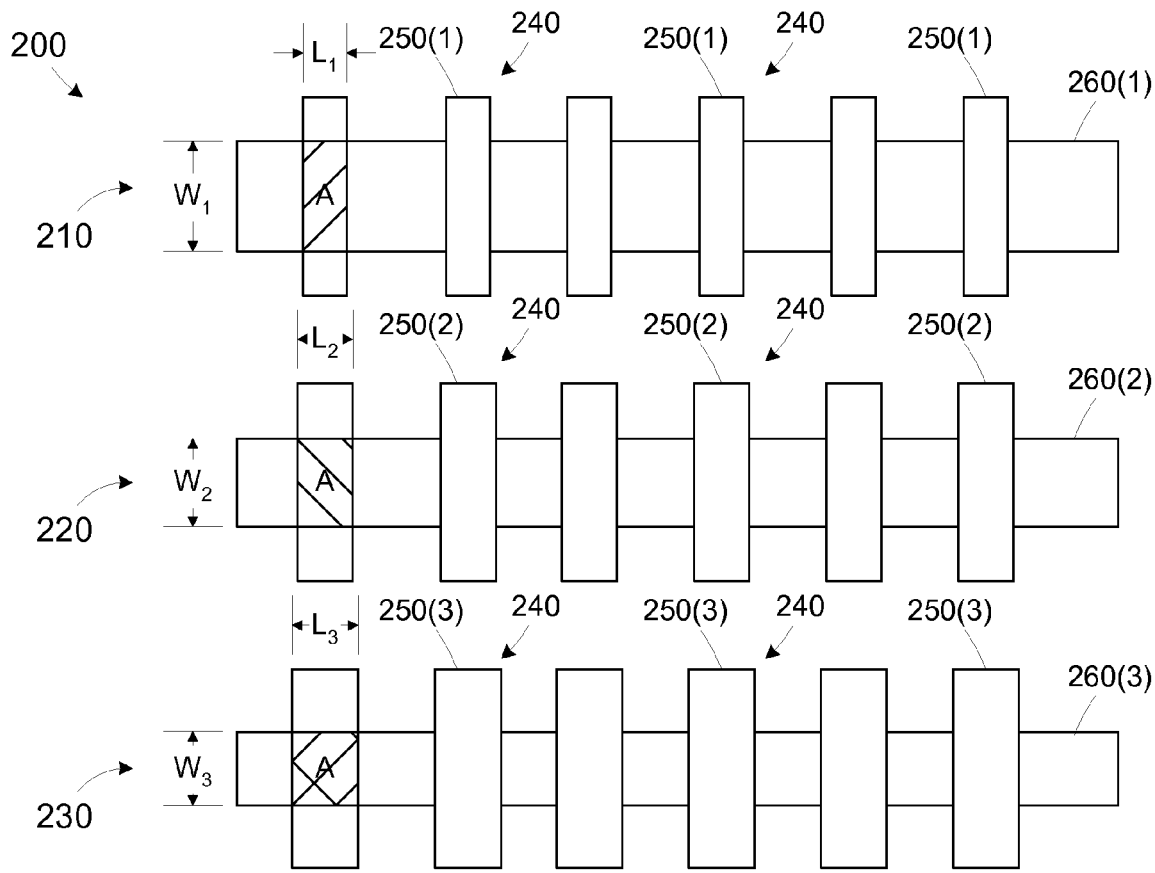
FIG. 2 is a top view of a test structure for distinguishing between dopant and line width performance variation in accordance with one illustrative embodiment of the present invention.

Referring now to the drawings wherein like reference numbers correspond to similar components throughout the several views and, specifically, referring to FIG. 2, the present invention shall be described in the context of an illustrative test structure 200. The test structure includes groups 210, 220, 230 of transistors 240. For clarity and ease of illustration, the depiction of the transistors 240 is simplified. Generally, a gate electrode 250(1), 250(2), 250(3) of each transistor 240 is formed over an associated active region 260(1), 260(2), 260(3). The gate electrodes 250(1), 250(2), 250(3) are characterized by their lengths, $L_1$, $L_2$, $L_3$, while the active regions 260(1), 260(2), 260(3) are characterized by their widths, $W_1$, $W_2$, $W_3$.

Figure 3:
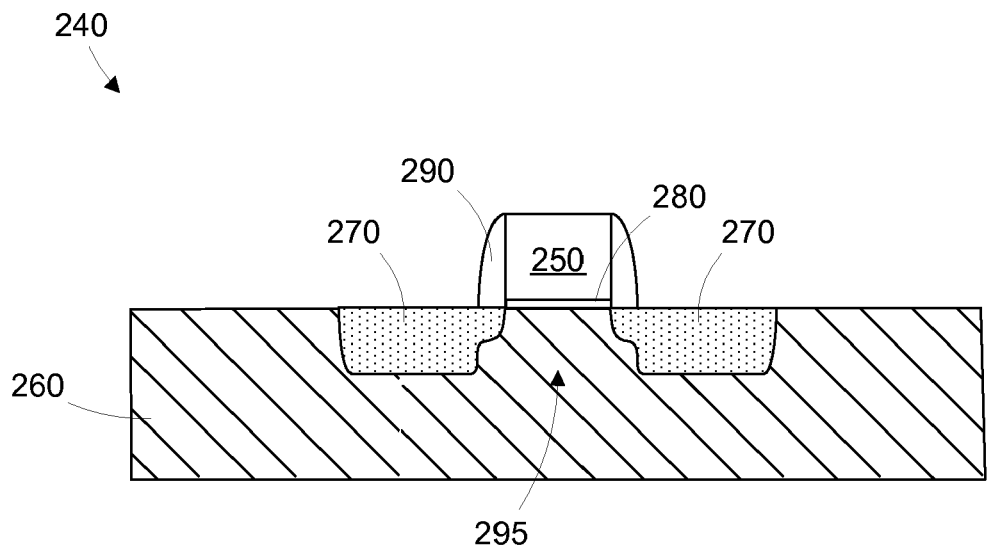
FIG. 3 is a cross-section view of a transistor used in the test structure of FIG. 2.

Referring briefly to FIG. 3, a cross-section view of an exemplary transistor 240 is shown. The transistor 240 includes active source/drain regions 260 defined in the substrate region 270. The gate electrode 250 is formed over a gate insulation layer 280. Spacers 290 may be provided for tailoring the shape of the source/drain regions 260 using well known implantation techniques. The channel region 295 of the transistors 240 is essentially defined by the region of intersection between the gate electrodes 250(1), 250(2), 250(3) and the active regions 260(1), 260(2), 260(3) (shown in FIG. 2).

For ease of illustration and to avoid obscuring the present invention, not all features of the transistors 240 are illustrated. For example, the gate electrode 250 may be comprised of polysilicon, and it may be covered by a silicide layer. The source/drain regions 260 may also include metal silicide regions. Various gate embodiments may be used, and their specific constructs are well known to those of ordinary skill in the art.

Returning to FIG. 2, the transistors 240 in each group 210, 220, 230 have essentially the same gate electrode length and active region width dimensions. However, across the groups 210, 220, 230, the gate electrode lengths, $L_1$, $L_2$, $L_3$ and active region widths, $W_1$, $W_2$, $W_3$ vary in a manner so as to keep the areas of the regions of intersection (i.e., the channel regions 295) substantially constant:

$$A_{CHANNEL} = L_1 * W_1 = L_2 * W_2 = L_3 * W_3$$

Where the language substantially constant is used in referring to the areas it is intended to reflect that the design areas for the transistors 240 in the different groups 210, 220, 230 are the same. When the transistors 240 are actually fabricated a small degree of area variation may exist. Fixing the area of the channel regions 295 essentially fixes the contribution of the random dopant variation across the groups 210, 220, 230. Accordingly, observed differences in variation across the groups 210, 220, 230 result primarily from length variation.

In the illustrated embodiment, the test structure 200 is formed on a test wafer, however, it is contemplated that multiple wafers may be used. The number of groups 210, 220, 230, as well as the number of transistors 240 in each group may vary depending on the particular implementation and the desired statistical robustness of the sample group.

Figure 4:
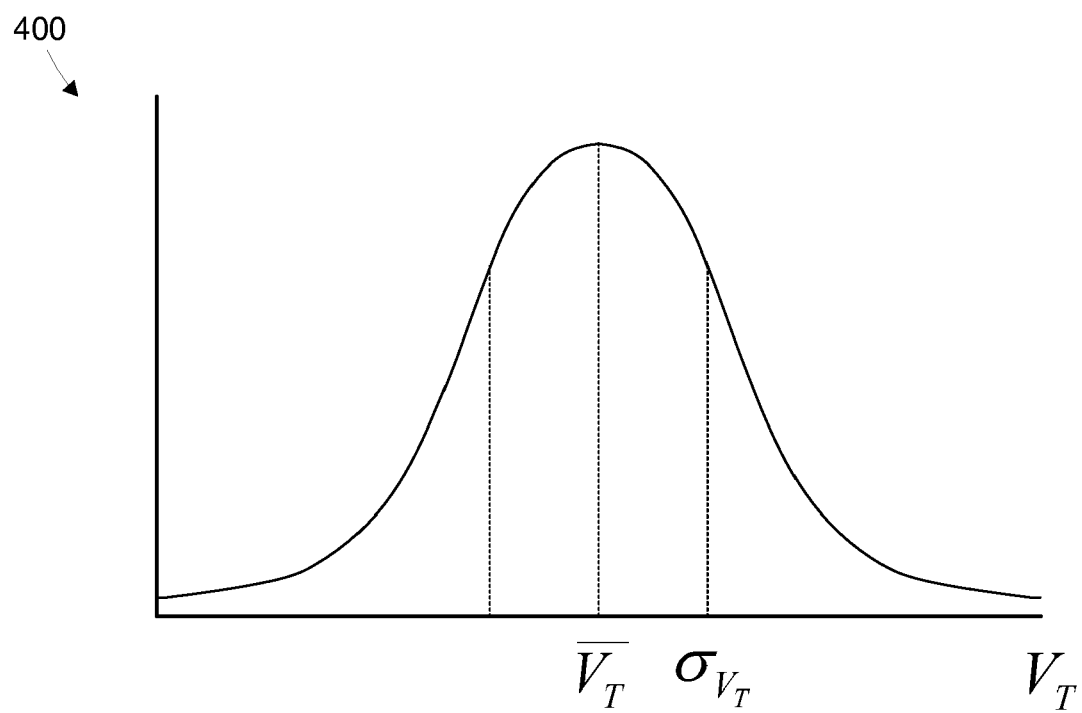
FIG. 4 is a diagram illustrating a threshold voltage distribution determined using the test structure of FIG. 2.

Following, the fabrication of the test structure 200, a performance metric for each of the groups 210, 220, 230 is measured and a metric distribution is determined. In one embodiment, the performance metric measured is threshold voltage, $V_T$. Turning briefly to FIG. 4, an exemplary threshold voltage distribution 400 is shown. The particular shape of an actual threshold voltage distribution may vary depending on the implementation, and the threshold voltage distribution 400 shown in FIG. 4 is provided only for exemplary purposes. Moreover, although the threshold voltage distribution 400 is shown in graphical form, it is contemplated that the threshold voltage distribution 400 may be analyzed numerically without the need for any graphical representation, such as by a general purpose computer or other processing device. Generally, the threshold voltage distribution 400 has an associated mean, $\nabla_T$, and standard deviation, $\sigma_{V_T}$. The standard deviation represents how closely the values are clustered about the mean. One standard deviation from the mean encompasses approximately 68% of the data values, while two standard deviations account for roughly 95% of the data values.

With respect to the test structure of FIG. 2, a threshold voltage distribution 400 is determined for each of the groups 210, 220, 230, resulting in mean threshold voltages, $\nabla_1$, $\nabla_2$, $\nabla_3$, and standard deviations, $\sigma_1$, $\sigma_2$, $\sigma_3$, associated with each length parameter, $L_1$, $L_2$, $L_3$.

Returning to FIG. 1, the threshold voltage roll-off curve 100 is essentially flat for lengths greater than the nominal length, $L_1$, referred to herein as super-nominal lengths. As a result, length variation in the super-nominal lengths does little to affect the threshold voltage, while length variation in the sub-nominal direction has a greater impact on threshold voltage variation. Hence, the variation observed in the super-nominal lengths primarily results from sources other than length variation, such as random dopant variation and all other sources of variation (e.g., width variation). Subsequently, the variation observed for $L_2$ and $L_3$ is due to the L variation, as L affects the area of the device and not the threshold voltage.

In a case where the threshold voltage roll-off curve 100 is not completely flat there may be some difference in the values of the super-nominal length variations. For example, the nominal length, $L_1$, may have been selected in the region of the roll-off curve 100 that is not entirely flat. Hence, the $L_2$ structure may still see a random length variation component. However, the dimensions of the $L_3$ structure are selected such that it is further to the right on the roll-off curve 100 in the flat region, and thus experiences does not contribute to the threshold voltage variation.

By comparing the standard deviations, $\sigma_1$, of the nominal length, $L_1$, to the standard deviations, $\sigma_2$, $\sigma_3$, of the super-nominal lengths, $L_2$, $L_3$, the component of the variation attributable to length variation may be distinguished and quantified.

Consider a first case where $L_2$ and $L_3$ are both in the flat region of the roll-off curve 100 where length variation does not significantly affect threshold variation. Thus, the standard deviations should be approximately equal. The length variation component for the nominal length, $L_1$, may then be determined by:

$$\sigma_1 = \sigma_1^L + \sigma_1^D + \sigma_1^O$$

$$\sigma_2 \approx \sigma_3$$

$$\sigma_3 = \sigma_3^D + \sigma_3^O$$

$$\sigma_1^L = \sigma_1 - \sigma_3$$

where $\sigma_n^L$ represents the random length component of the variation, $\sigma_n^D$ represents the random dopant component of the variation, and $\sigma_n^O$ represents the contribution from any other factors. As the area of the channel region 295 of the transistors 240 is fixed, the random dopant component is substantially the same for each group 210, 220, 230, so it cancels when the variation of associated with $L_1$ is subtracted from the variation associated with $L_3$. Also, the component arising from other factors is substantially the same across the groups 210, 220, 230, so it also cancels.

In a more particular example, assume that the threshold voltage variation for the $L_1$ group 210 is 30 mv and the threshold voltage variation for the $L_2$ and $L_3$ groups 220, 230 is 20 mv. The component of the total variation that may be attributed to random length variation is thus 10 mv.

Now consider a second case where $L_2$ is not in the flat region of the roll-off curve 100. The variation associated with the $L_2$ group 220 thus also has a random length variation. The random length variation component for both the $L_1$ group 210 and the $L_2$ group 220 may then be determined by comparing their associated variations to that of the $L_3$ group 230:

$$\sigma_1 = \sigma_1^L + \sigma_1^D + \sigma_1^O$$

$$\sigma_2 \neq \sigma_3$$

$$\sigma_2 = \sigma_2^L + \sigma_2^D + \sigma_2^O$$

$$\sigma_3 = \sigma_3^D + \sigma_3^O$$

$$\sigma_1^L = \sigma_1 - \sigma_3$$

$$\sigma_2^L = \sigma_2 - \sigma_3$$

The information derived from this case is useful for determining where the actual plateau of the threshold voltage roll-off curve actually lies. The accuracy to which this point may be determined depends on the number of groups used in the test structure and the size of the length steps used.

In a more particular example for the second case, assume that the threshold voltage variation for the $L_1$ group 210 is 30 mv, the threshold voltage variation for the $L_2$ group 220 is 25 mv, and the threshold voltage variation for the $L_3$ group 230 is 20 mv. The component of the total variation that may be attributed to random length variation is thus 10 mv for the $L_1$ group 210 and 5 mv for the $L_2$ group 220.

Distinguishing the random length variation from other sources of variation and quantifying that variation has numerous uses. Generally, there are competing factors associated with device size. For example, devices with smaller channel lengths may typically be operated at higher speeds and may be arranged with increased pattern density. However, if the random length variation component of the devices of a particular size is sufficiently large, the overall performance of the integrated circuit may be reduced. By quantifying the random length variation for a particular nominal length, design decisions may be made that allow a device to meet speed and pattern density constraints as well as exhibit acceptable levels of variation across the devices. Technology decisions may be made to determine which components to focus on to reduce the overall variation.

The data derived from the test structure 200 may be used to make these design choices or to modify an existing design if the observed variation is not acceptable. For example, if the random length variation component of 10 mv for $L_1$ in the second case described above is not acceptable from a design performance standpoint, the nominal length may be chosen to be at or closer to $L_2$ (i.e., with a random length variation of 5 mv). In one embodiment, an interpolation may be performed to predict the random length variation that would be seen in a device with a length between $L_1$ and $L_2$ or between $L_2$ and $L_3$. The accuracy of such an interpolation may be increased by adding additional groups to the test structure 200.

Figure 5:
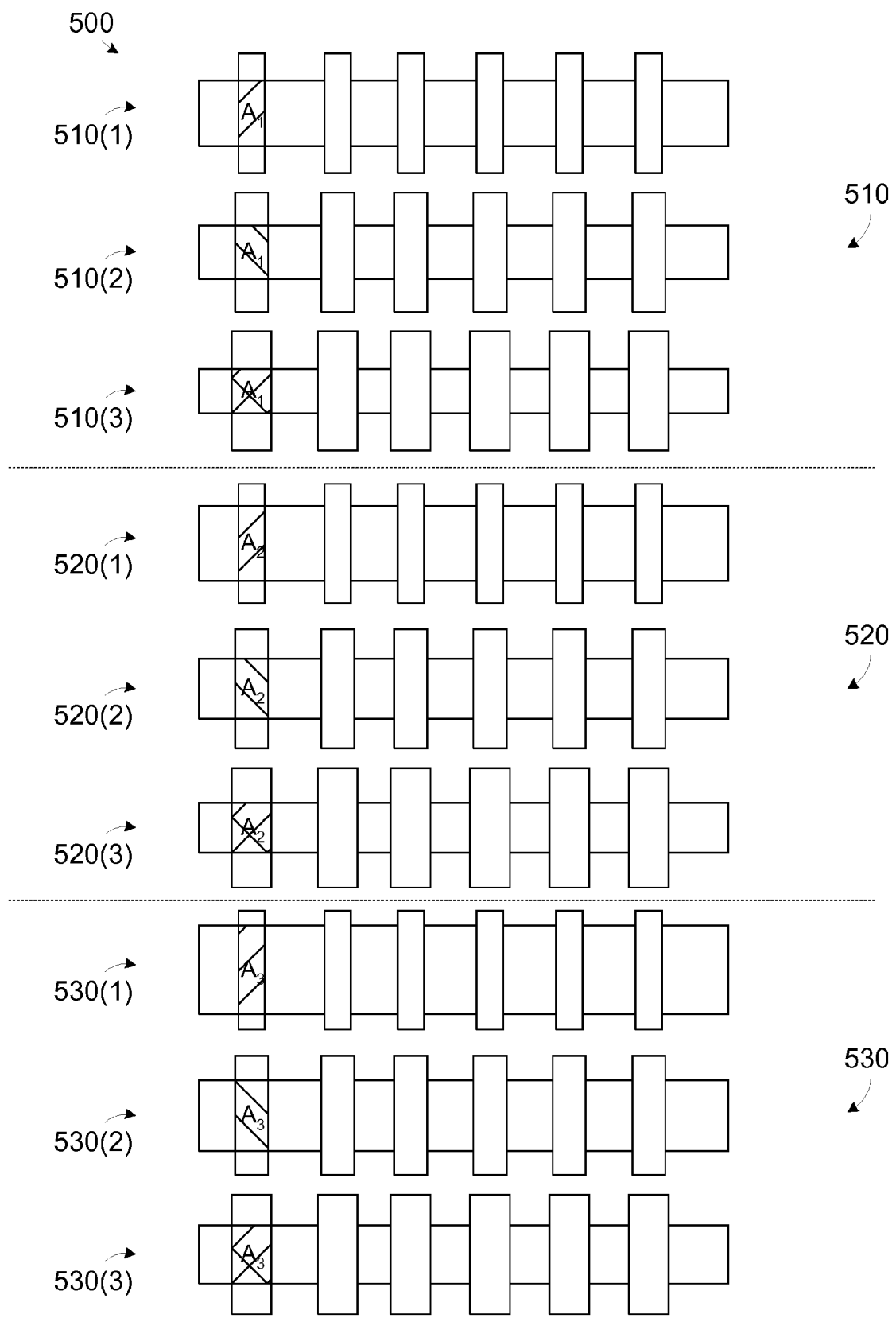
FIG. 5 is a top view of a test structure for distinguishing between dopant and line width performance variation in accordance with another illustrative embodiment of the present invention.

Turning now to FIG. 5, a test structure 500 in accordance with another embodiment of the present invention is shown. The test structure 500 includes multiple area groups 510, 520,

530. Each area group 510, 520, 530 has a plurality of length groups 510(1-3), 520(1-3), 520(1-3). Each area group 510, 520, 530 has an associated area, $A_1$, $A_2$, $A_3$, which is maintained constant within the area each group. The lengths of the gate electrodes varies across the length groups 510(1-3), 520(1-3) for a particular area group 510, 520, 530. For example, the area group 510 may be similar to the test structure of FIG. 2 with lengths of $L_1$, $L_2$, $L_3$ and active region widths of $W_1$, $W_2$, $W_3$. The area groups 510, 520, 530 may have increasing areas (i.e., $A_1 < A_2 < A_3$).

The threshold voltage distributions generated using the test structure 500 of FIG. 5 provides information about random length variation as well as random dopant variation. For example, the length variation for each area group 510, 520, 530 may be quantified as described above for FIG. 2. By comparing the total variation across the area groups 510, 520, 530, the random dopant variation and the total variation from other sources may be distinguished and quantified. Variation due to random dopants increases as the channel area decreases. The test structure 500 may be used to quantify this contribution.

Turning now to FIG. 6, a simplified flow diagram of a method for distinguishing between dopant and line width variation components in accordance with still another illustrative embodiment of the present invention is provided. In method block 600, a test structure (e.g., the test structure 200 of FIG. 2) is provided. The test structure including a first plurality of transistors having gate electrodes of a first length and a second plurality of transistors having gate electrodes of a second length different than the first length, wherein a channel area of the transistors in the first plurality is substantially equal to a channel area of the transistors in the second plurality. In method block 610, a performance metric of the first and second pluralities of transistors is measured. In method block 620, variation in the performance metric associated with the first plurality of transistors is compared to variation in the performance metric associated with the second plurality of transistors to identify a random length variation component associated with the first plurality of transistors. The process may be repeated for another set of transistors with a different area.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

We claim:

1. A method, comprising:
providing a test structure, the test structure including a first plurality of transistors having gate electrodes of a first length and a second plurality of transistors having gate electrodes of a second length different than the first length, wherein a design channel area of the transistors in the first plurality is substantially equal to a design channel area of the transistors in the second plurality;
measuring a performance metric of the first and second pluralities of transistors; and
comparing variation in the performance metric associated with the first plurality of transistors to variation in the performance metric associated with the second plurality of transistors to identify a random length variation component associated with the first plurality of transistors.

2. The method of claim 1, wherein comparing the variation further comprises subtracting the variation in the performance metric associated with the first plurality of transistors from the variation in the performance metric associated with the second plurality of transistors.

3. The method of claim 1, wherein measuring the performance metric comprises measuring a threshold voltage of the first and second pluralities of transistors.

4. The method of claim 3, further comprising determining a standard deviation of the threshold voltage for each of the first and second pluralities of transistors, and wherein comparing the variation further comprises comparing the standard deviation of the threshold voltage associated with the first plurality of transistors to the standard deviation of the threshold voltage associated with the second plurality of transistors.

5. The method of claim 1, further comprising:
selecting a nominal length of a transistor based on the random length variation component; and
fabricating an integrated circuit including the transistor.

6. The method of claim 1, wherein the test structure further comprises a third plurality of transistors having gate electrodes of a third length different than the first and second lengths, a design channel area of the transistors in the third plurality is substantially equal to the design channel area of the transistors in the first and second pluralities, and the method further comprises:
measuring a performance metric of the third plurality of transistors; and
comparing variation in the performance metric across the first, second, and third pluralities of transistors to identify the random length variation component associated with the first plurality of transistors.

7. The method of claim 1, wherein the test structure further comprises a third plurality of transistors having gate electrodes of a third length and a fourth plurality of transistors having gate electrodes of a fourth length different than the third length, a design channel area of the transistors in the third plurality is substantially equal to a design channel area of the transistors in the fourth plurality but different than the design channel area of the first and second pluralities of transistors, and the method further comprises:
measuring a performance metric of the third and fourth pluralities of transistors; and
comparing variation in the performance metric across the first, second, third, and fourth pluralities of transistors to identify a random dopant variation component associated with the pluralities of transistors.

8. The method of claim 7, further comprising comparing variation in the performance metric across the first, second, third, and fourth pluralities of transistors to identify an other source variation component associated with the pluralities of transistors.

9. The method of claim 1, wherein the second length is greater than the first length.

10. The method of claim 7, wherein the third length is greater than the second length, and the second length is greater than the first length.

11. The method of claim 1, further comprising forming the first and second pluralities of transistors on a common semiconductor wafer.

12. A method, comprising:
providing a test structure, the test structure including a first plurality of transistors having gate electrodes of a first length and a second plurality of transistors having gate electrodes of a second length different than the first length, wherein a design channel area of the transistors in the first plurality is substantially equal to a design channel area of the transistors in the second plurality;

measuring threshold voltages of the first and second pluralities of transistors;

determining standard deviations of the threshold voltages for each of the first and second pluralities of transistors; and comparing the standard deviations associated with the first and second pluralities of transistors to identify a random length variation component associated with the first plurality of transistors.

13. The method of claim 12, wherein the test structure further comprises a third plurality of transistors having gate electrodes of a third length different than the first and second lengths, a design channel area of the transistors in the third plurality is substantially equal to the design channel area of the transistors in the first and second pluralities, and the method further comprises:

measuring the threshold voltages of the third plurality of transistors;

determining a standard deviation of the threshold voltages for the third plurality of transistors; and comparing the standard deviations associated with the first, second, and third pluralities of transistors to identify the random length variation component associated with the first plurality of transistors.

14. A test structure, comprising:
a first plurality of transistors having gate electrodes of a first length; and
a second plurality of transistors having gate electrodes of a second length different than the first length, wherein a design channel area of the transistors in the first plurality is substantially equal to a design channel area of the transistors in the second plurality.

15. The test structure of claim 14, wherein the second length is greater than the first length.

16. The test structure of claim 14, further comprising:
a third plurality of transistors having gate electrodes of a third length different than the first and second lengths, wherein a design channel area of the transistors of the third plurality is substantially equal to the design channel area of the transistors in the first and second pluralities.

17. The test structure of claim 16, wherein the third length is greater than the second length, and the second length is greater than the first length.

18. The test structure of claim 14, wherein the first and second pluralities of transistors are formed on a common semiconductor wafer.

19. The test structure of claim 14, further comprising:
a third plurality of transistors having gate electrodes of a third length; and
a fourth plurality of transistors having gate electrodes of a fourth length different than the third length, wherein a design channel area of the transistors in the third plurality is substantially equal to a design channel area of the transistors in the fourth plurality but different than the design channel area of the first and second pluralities of transistors.

* * * * *